(12) United States Patent
Chang et al.

(10) Patent No.: US 10,663,756 B2
(45) Date of Patent: May 26, 2020

(54) DISPLAY APPARATUS

(71) Applicant: LUMENS CO., LTD., Yongin-si, Gyeonggi-do (KR)

(72) Inventors: HanBeet Chang, Yongin-si (KR); EunSung Shin, Yongin-si (KR); HyunYong Cho, Yongin-si (KR)

(73) Assignee: LUMENS CO., LTD., Yongin-si (KR)

( * ) Notice: Subject to any disclaimer, the term of this patent is extended or adjusted under 35 U.S.C. 154(b) by 273 days.

(21) Appl. No.: 15/650,845

(22) Filed: Jul. 14, 2017

(65) Prior Publication Data
US 2018/0017801 A1   Jan. 18, 2018

(30) Foreign Application Priority Data

Jul. 18, 2016  (KR) .................. 10-2016-0090627
Jul. 18, 2016  (KR) .................. 10-2016-0090648

(51) Int. Cl.
| | | |
|---|---|---|
| *G02B 30/26* | (2020.01) | |
| *G02B 5/32* | (2006.01) | |
| *H01L 27/15* | (2006.01) | |
| *H01L 27/12* | (2006.01) | |
| *H04N 13/324* | (2018.01) | |
| *H04N 13/302* | (2018.01) | |
| *H04N 13/344* | (2018.01) | |

(52) U.S. Cl.
CPC .............. *G02B 30/26* (2020.01); *G02B 5/32* (2013.01); *H01L 27/124* (2013.01); *H01L 27/156* (2013.01); *H04N 13/302* (2018.05); *H04N 13/324* (2018.05); *H04N 13/344* (2018.05)

(58) Field of Classification Search
None
See application file for complete search history.

(56) References Cited

U.S. PATENT DOCUMENTS

| | | | | |
|---|---|---|---|---|
| 7,205,960 | B2* | 4/2007 | David ................ | G02B 27/0103 345/204 |
| 8,213,065 | B2* | 7/2012 | Mukawa .............. | G02B 5/1814 345/7 |
| 8,325,166 | B2 | 12/2012 | Akutsu et al. | |
| 8,965,152 | B2* | 2/2015 | Simmonds ........... | G02B 6/0035 385/27 |
| 2006/0291021 | A1* | 12/2006 | Mukawa .................. | G02B 5/32 359/15 |
| 2007/0188837 | A1* | 8/2007 | Shimizu ................. | G02B 5/203 359/13 |
| 2012/0013651 | A1* | 1/2012 | Trayner ................... | G02B 5/32 345/690 |
| 2013/0222384 | A1* | 8/2013 | Futterer ................... | G02B 5/32 345/426 |

* cited by examiner

*Primary Examiner* — Derek S. Chapel
(74) *Attorney, Agent, or Firm* — Mei & Mark LLP

(57) ABSTRACT

A display apparatus is disclosed. The display apparatus includes: at least one LED display unit including a plurality of LED display panels outputting image lights; a light guide unit including a plurality of in-coupling zones where the image lights are received and a single out-coupling zone to which the received image lights are guided; a plurality of in-coupling holographic optical elements (HOEs) arranged in the in-coupling zones to define the propagation path of the image lights through the light guide unit; and a plurality of out-coupling HOEs arranged in the out-coupling zone to define a path through which the image lights guided through the light guide unit are sent outside the light guide unit.

24 Claims, 7 Drawing Sheets

DISPLAY APPARATUS

CROSS-REFERENCE TO RELATED APPLICATION(S)

The present application relates to and claims priority to Korean Patent Application Nos. 10-2016-0090627 and 10-2016-0090648, both of which are filed Jul. 18, 2016, the entire contents of which are incorporated herein by reference.

FIELD

The present invention relates to a display apparatus, and more specifically to a display apparatus using holographic optical elements (HOEs).

BACKGROUND

Three-dimensional (3D) display technologies using glasses based on binocular parallax are known. However, such technologies require wearing of polarized glasses, causing inconvenience to users. In an attempt to solve this problem, three-dimensional (3D) display technologies have been proposed, which use parallax barriers (for example, see FIG. 1a) and lenticular films (for example, see FIG. 1b) without having a need for glasses. See also a prior art document such as U.S. Pat. No. 8,325,166 B2. However, the parallax barriers block images and pictures to make them look dark, as illustrated in FIG. 1a. The use of lenticular films as illustrated in FIG. 1b has disadvantages in that interference between adjacent images makes it impossible to obtain clear 3D images. Another disadvantage of this approach is a low production yield. As such, there is still a need for enhanced and advanced technologies for 3D display technology.

SUMMARY

It is an object of the present invention to provide a display apparatus that is free from problems encountered in technologies using parallax barriers and lenticular films.

A display apparatus according to one aspect of the present invention includes: at least one LED display unit including a plurality of LED display panels outputting image lights; a light guide unit including a plurality of in-coupling zones where the image lights are received and a single out-coupling zone to which the received image lights are guided; a plurality of in-coupling holographic optical elements (HOEs) arranged in the in-coupling zones to define the propagation path of the image lights through the light guide unit; and a plurality of out-coupling HOEs arranged in the out-coupling zone to define a path through which the image lights guided through the light guide unit are sent outside the light guide unit.

According to one embodiment, the plurality of LED display panels include a first LED display panel including a plurality of two-dimensionally arrayed first LED cells to output a first wavelength image light, a second LED display panel including a plurality of two-dimensionally arrayed second LED cells to output a second wavelength image light, and a third LED display panel including a plurality of two-dimensionally arrayed third LED cells to output a third wavelength image light.

According to one embodiment, the first LED display panel, the second LED display panel, and the third LED display panel are arranged at two-dimensionally different positions on a single substrate.

According to one embodiment, the LED display unit further includes a single CMOS backplane coupled to the first LED display panel, the second LED display panel, and the third LED display panel and including a plurality of CMOS cells corresponding to the first LED cells, the second LED cells, and the third LED cells to individually drive the LED cells in groups.

According to one embodiment, the light guide unit includes a plurality of waveguides guiding the image lights individually received in the plurality of in-coupling zones to the out-coupling zone.

According to one embodiment, the plurality of waveguides may extend different distances in one lateral direction.

According to one embodiment, the light guide unit includes a first waveguide guiding a first wavelength image light outputted from the first LED display panel and received in a first in-coupling zone to the out-coupling zone, a second waveguide guiding a second wavelength image light outputted from the second LED display panel and received in a second in-coupling zone to the out-coupling zone, and a third waveguide guiding a third wavelength image light outputted from the third LED display panel and received in a third in-coupling zone to the out-coupling zone; the plurality of in-coupling HOEs include a first in-coupling HOE arranged on the first waveguide in the first in-coupling zone, a second in-coupling HOE arranged on the second waveguide in the second in-coupling zone, and a third in-coupling HOE arranged on the third waveguide in the third in-coupling zone; and the plurality of out-coupling HOEs are within the common out-coupling zone and include a first out-coupling HOE, a second out-coupling HOE, and a third out-coupling HOE arranged on the first waveguide, the second waveguide, and the third waveguide, respectively.

According to one embodiment, the first waveguide is positioned at the rear of the second waveguide and the third waveguide and is more elongated laterally in the lengthwise direction than the second waveguide and the third waveguide and the first in-coupling zone is formed in the elongated portion of the first waveguide; and the second waveguide is positioned at the rear of the third waveguide and is more elongated laterally in the lengthwise direction than the third waveguide and the second in-coupling zone is formed in the elongated portion of the second waveguide.

According to one embodiment, the plurality of in-coupling HOEs include first in-coupling HOEs including a first wavelength light in-coupling HOE, a second wavelength light in-coupling HOE arranged in the corresponding in-coupling zone, and a third wavelength light in-coupling HOE and second in-coupling HOEs including a first wavelength light in-coupling HOE, a second wavelength light in-coupling HOE, and a third wavelength light in-coupling HOE arranged in the corresponding in-coupling zone, the first wavelength light in-coupling HOEs, the second wavelength light in-coupling HOEs, and the third wavelength light in-coupling HOEs defining the propagation paths of first wavelength image lights, second first wavelength image lights, and third first wavelength image lights, respectively.

According to one embodiment, the plurality of out-coupling HOEs include first out-coupling HOEs and second out-coupling HOEs stacked adjacent to the light guide unit in the out-coupling zone; the first out-coupling HOEs include a first wavelength light out-coupling HOE, a second wavelength light out-coupling HOE, and a third wavelength light out-coupling HOE arranged in the out-coupling zone such that the first wavelength image light, the second wavelength image light, and the third wavelength image light are sent toward the left eye of a viewer outside the light guide unit; and the second out-coupling HOEs include a first wavelength light out-coupling HOE, a second wavelength light out-coupling HOE, and a third wavelength light out-coupling HOE arranged in the out-coupling zone such that the first wavelength image light, the second wavelength image light, and the third wavelength image light are sent toward the right eye of the viewer.

According to one embodiment, the light guide unit includes a plurality of waveguides including a first waveguide guiding first wavelength image lights outputted from first wavelength light emitting display panels and received in the plurality of in-coupling zones to the out-coupling zone, a second waveguide guiding second wavelength image lights outputted from second wavelength light emitting display panels and received in the plurality of in-coupling zones to the out-coupling zone, and a third waveguide guiding third wavelength image lights outputted from third wavelength light emitting display panels and received in the plurality of in-coupling zones to the out-coupling zone.

According to one embodiment, the plurality of in-coupling HOEs include a first wavelength in-coupling HOE arranged on one side of the first waveguide in the plurality of in-coupling zones, a second wavelength in-coupling HOE arranged on one side of the second waveguide in the plurality of in-coupling zones, and a third wavelength in-coupling HOE arranged on one side of the third waveguide in the plurality of in-coupling zones.

According to one embodiment, the plurality of out-coupling HOEs include first wavelength light out-coupling HOEs stacked adjacent to the first waveguide in the out-coupling zone, second wavelength light out-coupling HOEs stacked adjacent to the second waveguide in the out-coupling zone, and third wavelength light out-coupling HOEs stacked adjacent to the third waveguide in the out-coupling zone.

According to one embodiment, each of the plurality of in-coupling HOEs is arranged in the corresponding in-coupling zone and the plurality of out-coupling HOEs are arranged in the out-coupling zone.

According to one embodiment, the light guide unit includes waveguides whose shape is straight or bent as a whole.

According to one embodiment, the display apparatus further includes collimating lenses arranged between the LED display panels and the light guide unit to collimate the image lights.

According to one embodiment, the LED display unit further includes an LED display panel including a plurality of LED cells and a CMOS backplane including a plurality of CMOS cells; and bumps are interposed between the LED cells and the CMOS cells in a state in which the LED cells and the CMOS cells are arranged to face each other.

According to one embodiment, the plurality of LED cells are formed by growing a first conductive semiconductor layer, an active layer, and a second conductive semiconductor layer in this order on a substrate and etching the layers; each of the plurality of LED cells has a vertical structure including the substrate, the first conductive semiconductor layer, the active layer, and the second conductive semiconductor layer formed in this order; the active layer and the second conductive semiconductor layer are removed from the exposed portions of the LED display panel where none of the plurality of LED cells are formed; and a first conductive metal layer is formed over the portion of the first conductive semiconductor layer where none of the LED cells of the LED display panel are formed.

According to one embodiment, the 3D display apparatus can be considerably reduced in thickness. The 3D display apparatus can elaborately display pictures and images to both eyes of a viewer so that the images and pictures can be clearly represented. In addition, the 3D display apparatus can clearly display images and pictures three-dimensionally without the need for polarized glasses, is not substantially limited in size, and is applicable to not only large displays but also micro-displays, such as HMDs and HUDs.

According to a further embodiment, the display apparatus uses a display unit including LED display panels emitting image lights of various colors. The image lights of various colors emitted from the display unit are collected and focused into a single location so that full-color images with high quality can be provided to the eyes of a viewer. Furthermore, the display apparatus has the advantages of simple structure and light weight. Other features and advantages of the present invention will be appreciated understood from the following description of the embodiments.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION

Example embodiments of the present technology will be described with reference to the accompanying drawings.

First Embodiment

Figure 1A:
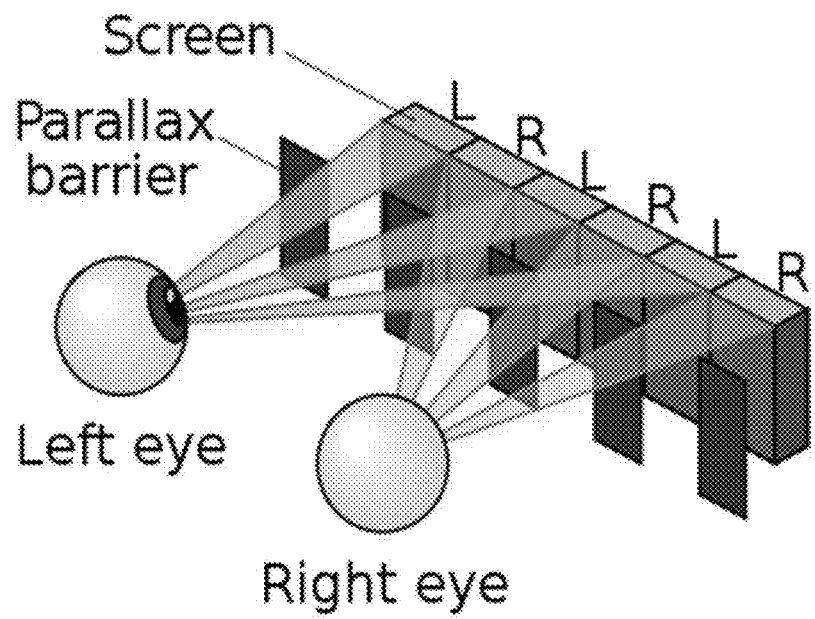
FIGS. 1a and 1b are diagrams for illustrating related art.
Figure 1B:
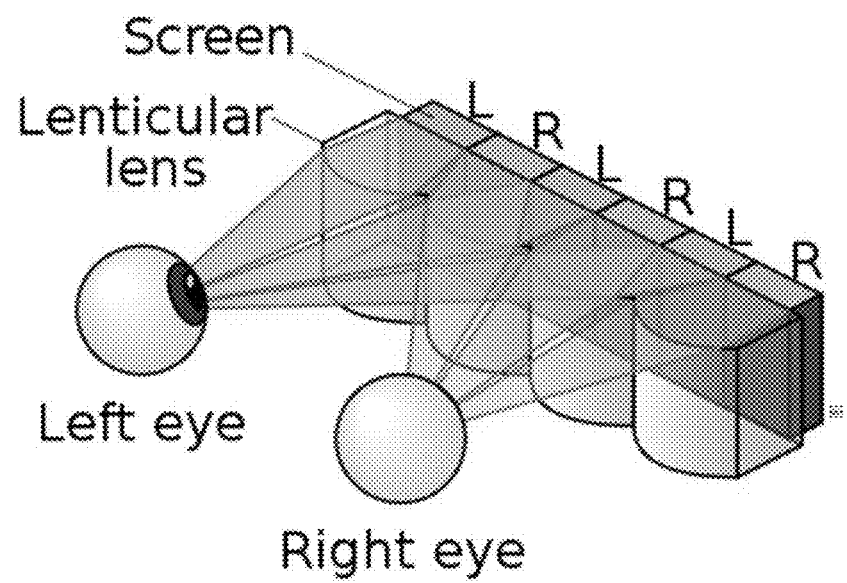
Figure 2:
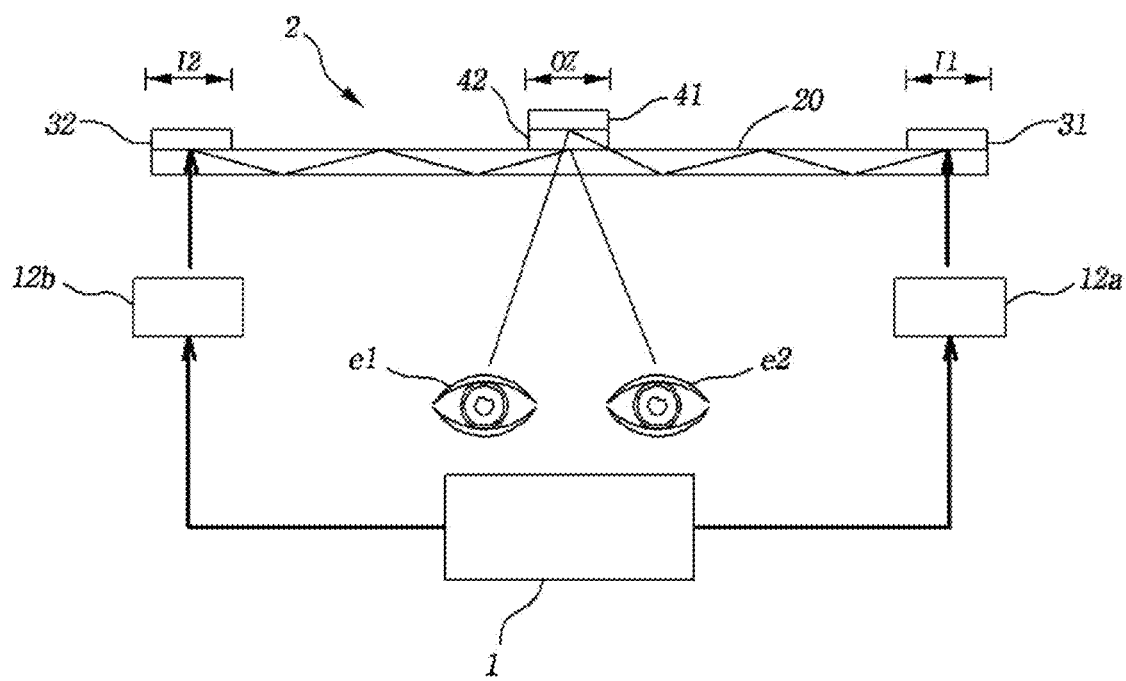
FIG. 2 is a view for illustrating the constitution of a 3D display apparatus according to a first embodiment of the present disclosure.

FIG. 2 illustrates the constitution of a 3D display apparatus according to a first embodiment of the present invention.

Referring to FIG. 2, the 3D display apparatus is constructed such that a left eye's image is merged with a right eye's image in a side-by-side format and the merged image is outputted. The 3D display apparatus includes an image source unit 1 providing a left eye image source and a right eye image source, a first display unit 12a receiving the left eye image source from the image source unit 1 and outputting a left eye image light, a second display unit 12b receiving the right eye image source from the image source unit 1 and outputting a right eye image light, and a 3D image display unit 2 where the left eye image light and the right eye image light are transmitted through a light guide unit including a waveguide 20 and the images are merged to output a 3D image.

The image source unit 1 is adapted to separately provide a left eye image source and a right eye image source, which are separately taken with a suitable instrument, for example, a dual camera. The first display unit 12a is adapted to display a left eye's image provided from the image source unit 1 and includes a plurality of two-dimensionally arrayed LED cells. The second display unit 12b is adapted to display a right eye's image provided from the image source unit 1 and includes a plurality of two-dimensionally arrayed LED cells.

The waveguide 20 of the light guide unit of the 3D image display unit 2 has a first in-coupling zone I1 and a second in-coupling zone I2 formed at left and right sides in the lengthwise direction, respectively, and an out-coupling zone OZ formed between the in-coupling zones I1 and I2. The 3D image display unit 2 includes a first in-coupling HOE 31 arranged in the first in-coupling zone I1, a second in-coupling HOE 32 arranged in the second in-coupling zone I2, and a first out-coupling HOE 41 and a second out-coupling HOE 42 arranged in the out-coupling zone OZ.

Although not illustrated, a lens may be arranged between the first display unit 12a and the first in-coupling zone I1 to collimate the image lights of the left eye's image displayed from the first display unit 12a and a lens may be arranged between the second display unit 12b and the second in-coupling zone I2 to collimate the image lights of the right eye' image displayed from the second display unit 12b.

The first in-coupling HOE 31 deflects the collimated left eye image lights entering the first in-coupling zone I1 of the waveguide 20 and defines the propagation direction and path of the left eye image lights in the direction toward the first out-coupling HOE 41 through the waveguide 20. The second in-coupling HOE 32 deflects the collimated right eye image lights entering the second in-coupling zone I2 of the waveguide 20 and defines the propagation direction and path of the right eye image lights in the direction toward the second out-coupling HOE 42 through the waveguide 20.

The left eye image lights are hologrammed in the first in-coupling HOE 31, travel along the waveguide 20 by total internal reflection, and reaches the out-coupling zone OZ. The first out-coupling HOE 41 deflects the left eye image lights and sends the deflected left eye image lights toward the left eye e1 of a viewer. The right eye image lights are hologrammed in the second in-coupling HOE 32, travel along the waveguide 20 by total internal reflection, and reaches the out-coupling zone OZ. The second out-coupling HOE 42 deflects the right eye image lights and sends the deflected right eye image lights toward the right eye e2 of the viewer. The paths through which the left eye image lights and the right eye image lights escape the waveguide 20 from the out-coupling zone OZ are defined by the first out-coupling HOE 41 and the second out-coupling HOE 42.

The propagation directions and paths of the left eye image lights within the waveguide 20 and from the waveguide 20 toward the left eye e1 of a viewer are determined by the first in-coupling HOE 31 and the first out-coupling HOE 41, respectively, such that the left eye image lights are projected only to the left eye e1 of the viewer. Likewise, the propagation directions and paths of the left eye image lights within the waveguide 20 and from the waveguide 20 toward the right eye e2 of the viewer are determined by the second in-coupling HOE 32 and the second out-coupling HOE 42, respectively, such that the right eye image lights are projected only to the right eye e2 of the viewer. As a result, the viewer feels a 3D image by his/her binocular parallax.

The left eye's image and the right eye's image constituting the 3D image outputted from the 3D image display unit 2 can be projected to both eyes of the viewer by various sensing technologies, for example, iris recognition. This is less directly relevant to the spirit of the present invention and thus its description is omitted.

Second Embodiment

Figure 3:
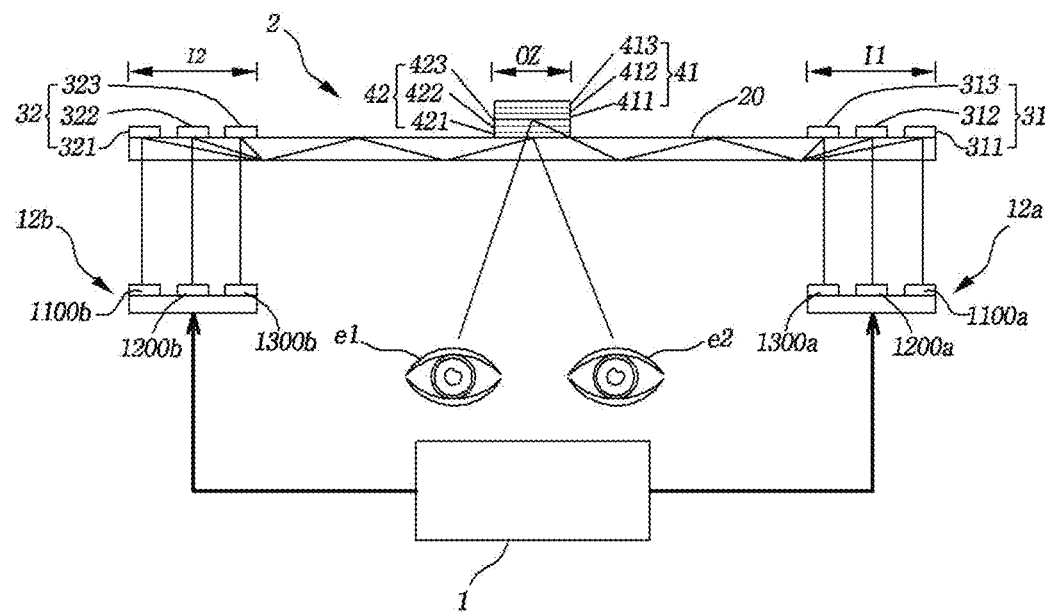
FIG. 3 is a view for illustrating the constitution of a 3D display apparatus according to a second embodiment of the present disclosure.

FIG. 3 illustrates the constitution of a 3D display apparatus according to a second embodiment of the present invention.

Referring to FIG. 3, the 3D display apparatus includes first and second display units 12a and 12b (hereinafter collectively referred to as "12"). The first and second display units 12 include red light emitting display panels 1100a and 1100b (hereinafter collectively referred to as "1100"), each of which includes a plurality of two-dimensionally arrayed red LED cells emitting red image lights, green light emitting display panels 1200a and 1200b (hereinafter collectively referred to as "1200"), each of which includes a plurality of two-dimensionally arrayed green LED cells emitting green image lights, and blue light emitting display panels 1300a and 1300b (hereinafter collectively referred to as "1300"), each of which includes a plurality of two-dimensionally arrayed blue LED cells emitting blue image lights, respectively.

The red light emitting display panel 1100a, the green light emitting display panel 1200a, and the blue light emitting display panel 1300a are arrayed parallel to each other at two-dimensionally different positions on a single substrate. The red light emitting display panel 1100b, the green light emitting display panel 1200b, and the blue light emitting display panel 1300b are arrayed parallel to each other at two-dimensionally different positions on a single substrate.

A waveguide 20 has a first in-coupling zone I1 consisting of a red light in-coupling zone, a green light in-coupling zone, and a blue light in-coupling zone corresponding to the red light emitting display panel 1100a, the green light emitting display panel 1200a, and the blue light emitting display panel 1300a, respectively. The red light in-coupling zone, the green light in-coupling zone, and the blue light in-coupling zone individually receive the red image lights, the green image lights, and the blue image lights emitted from the display panels 1100a, 1200a, and 1300a, respectively. The waveguide 20 guides the image lights to a central out-coupling zone OZ. A waveguide 20 has a second in-coupling zone I2 consisting of a red light in-coupling zone, a green light in-coupling zone, and a blue light in-coupling zone corresponding to the red light emitting display panel 1100b, the green light emitting display panel 1200b, and the blue light emitting display panel 1300b, respectively. The red light in-coupling zone, the green light in-coupling zone, and the blue light in-coupling zone individually receive the red image lights, the green image lights, and the blue image lights emitted from the display panels 1100b, 1200b, and 1300b, respectively. The waveguide 20 guide the image lights to the central out-coupling zone OZ.

First in-coupling HOEs 31 include a red light in-coupling HOE 311, a green light in-coupling HOE 312, and a blue light in-coupling HOE 313 arranged in the red light in-coupling zone, the green light in-coupling zone, and the blue light in-coupling zone of the first in-coupling zone I1, respectively. Second in-coupling HOEs 32 include a red light in-coupling HOE 321, a green light in-coupling HOE 322, and a blue light in-coupling HOE 323 arranged in the red light in-coupling zone, the green light in-coupling zone, and the blue light in-coupling zone of the second in-coupling zone I2, respectively.

In the first in-coupling HOEs 31, the red light in-coupling HOE 311 diffracts and holograms the red image lights entering from the red light emitting display panel 1100a of the first display unit 12a and deflects the hologrammed red image lights, the green light in-coupling HOE 312 diffracts and holograms the green image lights entering from the green light emitting display panel 1200a of the first display unit 12a and deflects the hologrammed green image lights, and the blue light in-coupling HOE 313 diffracts and holograms the blue image lights entering from the blue light emitting display panel 1300a of the first display unit 12a and deflects the hologrammed blue image lights.

Also in the second in-coupling HOE 32, the red light in-coupling HOE 321 diffracts and holograms the red image lights entering from the red light emitting display panel 1100b of the first display unit 12b and deflects the hologrammed red image lights, the green light in-coupling HOE 322 diffracts and holograms the green image lights entering from the green light emitting display panel 1200b of the first display unit 12b and deflects the hologrammed green image lights, and the blue light in-coupling HOE 323 diffracts and holograms the blue image lights entering from the blue light emitting display panel 1300b of the first display unit 12b and deflects the hologrammed blue image lights.

The first out-coupling HOEs 41 and the second out-coupling HOEs 42 are stacked adjacent to the back side of the waveguide 20 in one out-coupling zone OZ. The first out-coupling HOEs 41 and 42 include red light out-coupling HOEs 411 and 421, green light out-coupling HOEs 412 and 422, and blue light out-coupling HOEs 413 and 423, respectively. The red light out-coupling HOE 411, the green light out-coupling HOE 412, and the blue light out-coupling HOE 413 of the first out-coupling HOEs 41 are arranged in this order from the bottom. The red light out-coupling HOE 421, the green light out-coupling HOE 422, and the blue light out-coupling HOE 423 of the second out-coupling HOEs 41 are arranged in this order from the bottom.

The red image lights, the green image lights, and the blue image lights whose propagation paths in the waveguide 20 are determined by the red light in-coupling HOE 311, the green light in-coupling HOE 312, and the blue light in-coupling HOE 313 of the first in-coupling HOEs 31 in the first in-coupling zone I1 of the waveguide 20 reach the out-coupling zone OZ, are diffracted and deflected by the red light out-coupling HOE 411, the green light out-coupling HOE 412, and the blue light out-coupling HOE 413 of the first out-coupling HOEs 41, and are sent toward the left eye e1 of a viewer outside the waveguide 20.

The red image lights, the green image lights, and the blue image lights whose propagation paths in the waveguide 20 are determined by the red light in-coupling HOE 321, the green light in-coupling HOE 322, and the blue light in-coupling HOE 323 of the second in-coupling HOEs 32 in the second in-coupling zone I2 of the waveguide 20 reach the out-coupling zone OZ, are diffracted and deflected by the red light out-coupling HOE 421, the green light out-coupling HOE 422, and the blue light out-coupling HOE 423 of the second out-coupling HOEs 42, and are sent toward the right eye e2 of the viewer outside the waveguide 20.

Figure 4:
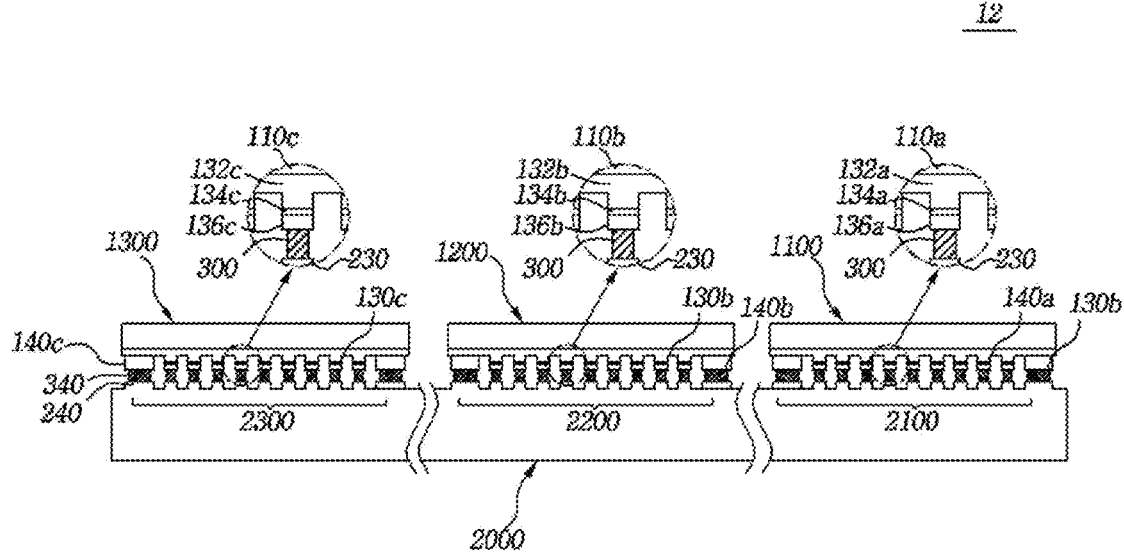
FIG. 4 is a view for illustrating a display unit of the 3D display apparatus as shown in FIG. 3.

The display unit is illustrated in detail in FIG. 4. The red, green, and blue LED display panels 1100, 1200, and 1300 of the display unit 12 include a plurality of two-dimensionally arrayed micro-LED cells 130a, 130b, and 130c, respectively.

The LED display panels 1100, 1200, and 1300 emits image lights of different wavelength bands. More specifically, the red LED display panel 1100 is adapted to emit red display lights (i.e. red image lights), the green LED display panel 1200 is adapted to emit green display lights (i.e. green image lights), and the blue LED display panel 1300 is adapted to emit blue display lights (i.e. blue image lights). The display unit includes a single CMOS backplane 2000 adapted to individually drive the LED cells 130a of the LED display panel 1100, the LED cells 130b of the LED display panel 1200, and the LED cells 130c of the LED display panel 1300 to achieve full color. The single CMOS backplane 2000 includes a plurality of CMOS cells 230 corresponding to the LED cells 130a of the LED display panel 1100, the LED cells 130b of the LED display panel 1200, and the LED cells 130c of the LED display panel 1300. The CMOS backplane 2000 has CMOS cell areas 2100, 2200, and 2300 in which the LED display panels 1100, 1200, and 1300 are arranged, respectively. The LED display panels 1100, 1200, and 1300 are flip-chip bonded to the CMOS cell areas 2100, 2200, and 2300, respectively. The CMOS cells 230 are electrically connected to the LED cell 130a, 130b, and 130c by flip-chip bonding of the LED display panels 1100, 1200, and 1300 to the single CMOS backplane 2000. For this electrical connection, the plurality of CMOS cells 230 corresponding to the plurality of micro-LED cells of the LED display panels 1100, 1200, and 1300 are formed in the CMOS cell regions 2100, 2200, and 2300, respectively. The CMOS cells 230 are electrically connected to the LED cells 130a, 130b, and 130c through bumps 300.

A common cell 240 is formed in each of the CMOS cell regions 2100, 2200, and 2300 on the single CMOS backplane 2000. The common cells 240 are electrically connected to first conductive metal layers of the LED display panels 1100, 1200, and 1300 through common bumps 340.

In the current state of the art, it is difficult to form structures emitting red, green, and blue image lights on a single substrate in the fabrication of an LED display device. In the present invention, the plurality of independently constructed LED display panels emitting red, green, and blue lights of different wavelength bands are flip-chip bonded to the single CMOS backplane 2000.

The LED display device is driven in response to control signals from a drive IC. The control signals from the drive IC are transmitted to the LED cell 130a, 130b, and 130c by the CMOS cells 230 (i.e. CMOS integrated circuits) formed in the CMOS backplane 2000. The control signals from the drive IC may be analog or digital signals. The digital signals may also be pulse width modulation (PWM) signals.

A method for constructing the display unit will be illustrated with reference to FIG. 5.

Figure 5:
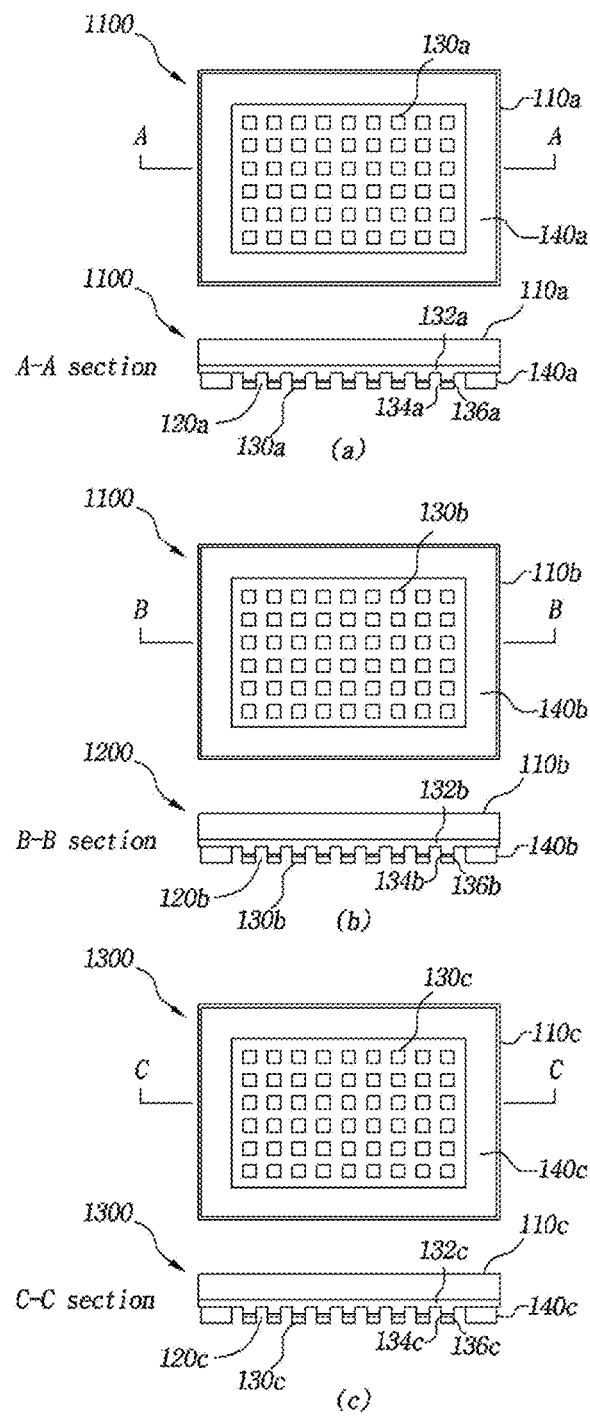
FIGS. 5 and 6 are views for illustrating a method for constructing the display unit as shown in FIG. 4.

Referring first to (a), (b) and (c) of FIG. 5, the LED display panels 1100, 1200, and 1300 are formed by growing first conductive semiconductor layers 132a, 132b, and 132c, active layers 134a, 134b, and 134c, and second conductive semiconductor layers 136a, 136b, and 136c in this order on transparent substrates 110a, 110b, and 110c, respectively, followed by etching. The resulting LED cells 130a, 130b, and 130c formed on the first, second, and third LED display panels 1100, 1200, and 1300 have vertical structures including the first conductive semiconductor layers 132a, 132b, and 132c, the active layers 134a, 134b, and 134c, and the second conductive semiconductor layers 136a, 136b, and 136c on the transparent substrates 110a, 110b, and 110c, respectively.

The transparent substrates 110a, 110b, and 110c are made of a material selected from sapphire, SiC, Si, glass, and ZnO. The first conductive semiconductor layers 132a, 132b, and 132c may be n-type semiconductor layers and the second conductive semiconductor layers 136a, 136b, and 136c may be p-type semiconductor layers. The active layers 134a, 134b, and 134c are regions where electrons from the first conductive semiconductor layers 132a, 132b, and 132c recombine with holes from the second conductive semiconductor layer 136a, 136b, and 136c when power is applied.

The second conductive semiconductor layers 136a, 136b, and 136c and the active layers 134a, 134b, and 134c are removed from the etched portions 120a, 120b, and 120c of the LED panels 1100, 1200, and 1300 where none of the LED cells 130a, 130b, and 130c are formed, and as a result, the first conductive semiconductor layers 132a, 132b, and 132c are exposed in the etched portions, respectively. The LED display panels 1100, 1200, and 1300 include first conductive metal layers 140a, 140b, and 140c formed over the portions 120a, 120b, and 120c of the first conductive semiconductor layers 132a, 132b, and 132c where none of the LED cells 130a, 130b, and 130c are formed, respectively. The first conductive metal layers 140a, 140b, and 140c are spaced apart from the LED cells 130a, 130b, and 130c, respectively. The first conductive metal layers 140a, 140b, and 140c are formed with predetermined widths along the peripheries of the LED display panels 1100, 1200, and 1300 on the first conductive semiconductor layers 132a, 132b, and 132c, respectively. The first conductive metal layers 140a, 140b, and 140c have substantially the same heights as the LED cells 130a, 130b, and 130c, respectively. The first conductive metal layers 140a, 140b, and 140c are electrically connected to the CMOS backplane 2000 through the bumps 340. As a result, the first conductive metal layers 140a, 140b, and 140c function as common electrodes of the LED cells 130a, 130b, and 130c, respectively.

The plurality of CMOS cells 230 of the CMOS backplane 2000 serve to individually drive the micro-LED cells 130a, 130b, and 130c. The CMOS cells 230 are electrically connected to the corresponding LED cells 130a, 130b, and 130c through bumps 300. The CMOS cells 230 are integrated circuits for individually driving the corresponding LED cells 130a, 130b, and 130c. The CMOS backplane 2000 may be, for example, an active matrix (AM) panel. Specifically, each of the CMOS cells 230 may be a pixel driving circuit including two transistors and one capacitor. When the LED display panels 1100, 1200, and 1300 are flip-chip bonded to the CMOS backplane 2000 through the bumps, each of the micro-LED cells may be arranged between a drain terminal and a common ground terminal of a transistor of the pixel driving circuit to form an equivalent circuit.

The CMOS backplane 2000 includes common cells 240 formed at positions corresponding to the first conductive metal layers 140a, 140b, and 140c. The first conductive metal layers 140a, 140b, and 140c are electrically connected to the common cells 240 through the common bumps 340. Herein, the term "bumps" are often intended to include the bumps 300 electrically connecting the plurality of CMOS cells to the LED cells 130a, 130b, and 130c and the common bumps 340 electrically connecting the first conductive metal layers 140a, 140b, and 140c to the common cells 240.

Figure 6:
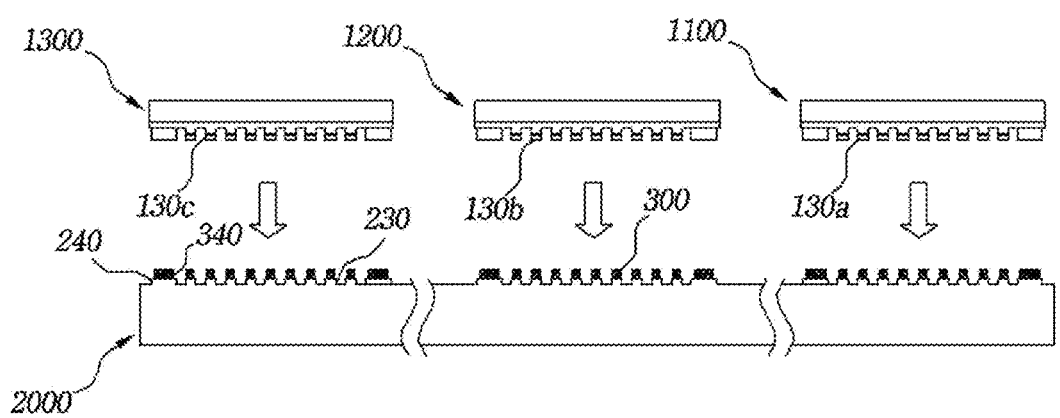

As illustrated in FIG. 6, the CMOS backplane 2000 on which the CMOS cells 230 are arranged faces the LED display panels 1100, 1200, and 1300. After the CMOS cells 230 are brought into contact with the LED cells 130a, 130b, and 130c in a one-to-one relationship, the bumps 300 and the common bumps 340 are melted by heating. As a result, the CMOS cells 230 are electrically connected to the corresponding LED cells 130a, 130b, and 130c.

Third Embodiment

Figure 7:
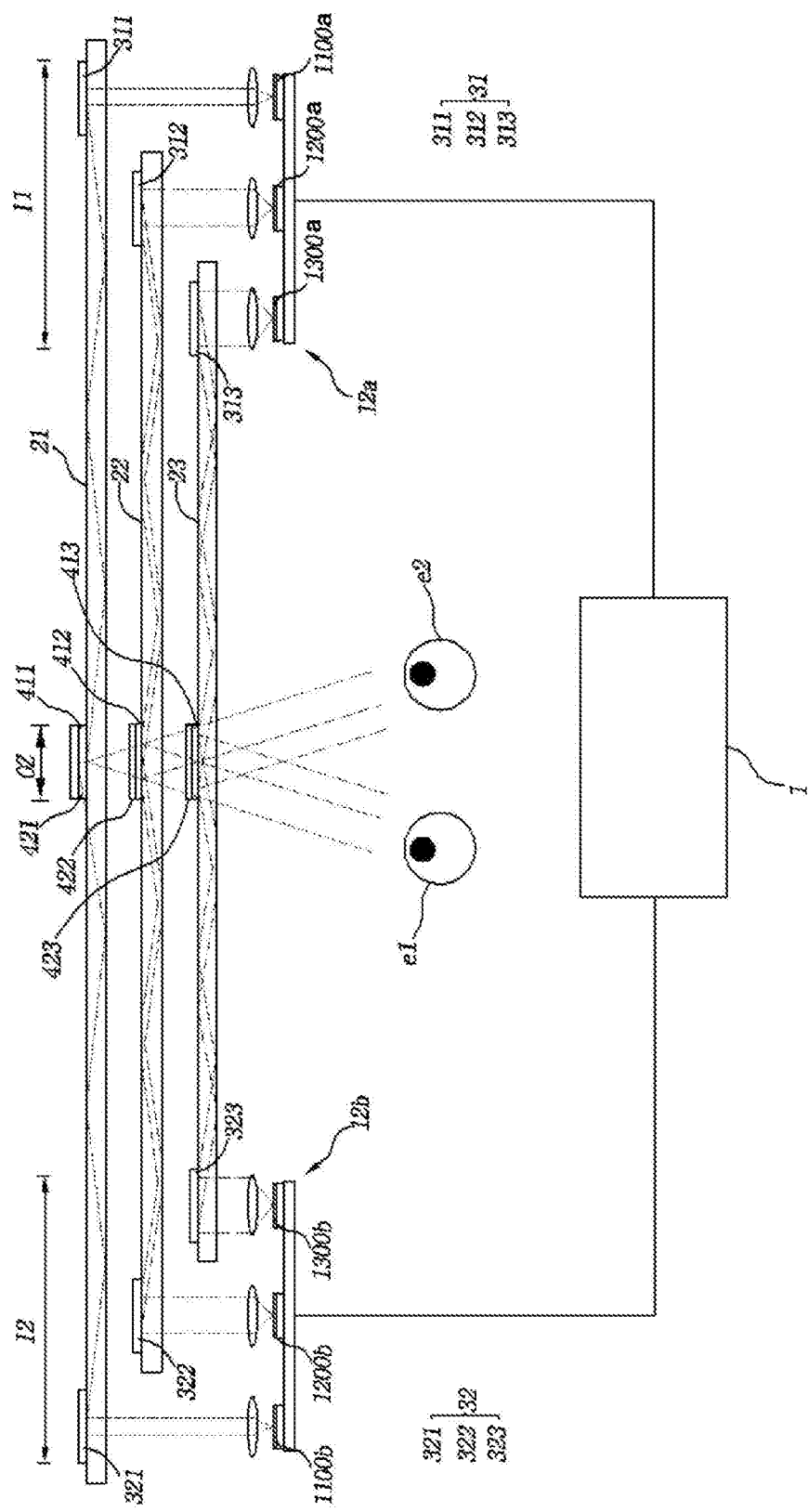
FIG. 7 is a view for illustrating the constitution of a 3D display apparatus according to a third embodiment of the present disclosure.

FIG. 7 illustrates the constitution of a 3D display apparatus according to a third embodiment of the present invention.

Referring to FIG. 7, the 3D display apparatus includes a light guide unit. The light guide unit includes a first waveguide 21 guiding red image lights emitted from red light emitting display panels 1100a and 1100b of first and second display units 12a and 12b and received in first and second in-coupling zone I1 and I2, respectively, to a central out-coupling zone OZ, a second waveguide 22 guiding green image lights emitted from green light emitting display panels 1200a and 1200b of the first and second display units 12a and 12b and received in the first and second in-coupling zone I1 and I2, respectively, to the central out-coupling zone OZ, and a third waveguide 23 guiding blue image lights emitted from blue light emitting display panels 1300a and 1300b of the first and second display units 12a and 12b and received in the first and second in-coupling zone I1 and I2, respectively, to the central out-coupling zone OZ.

First and second in-coupling HOEs 31 and 32 consist of red light in-coupling HOEs 311 and 321, green light in-coupling HOEs 312 and 322, and blue light in-coupling HOEs 313 and 323, respectively. The red light in-coupling HOE 311 is arranged at one back side of the first waveguide 21 and the red light in-coupling HOE 321 is arranged at the other back side of the first waveguide 21. The green light in-coupling HOE 312 is arranged at one back side of the second waveguide 22 and the green light in-coupling HOE 322 is arranged at the other back side of the second waveguide 22. The blue light in-coupling HOE 313 is arranged at one back side of the third waveguide 23 and the blue light in-coupling HOE 323 is arranged at the other back side of the third waveguide 23. The red light in-coupling HOE 311, the green light in-coupling HOE 312, and the blue light in-coupling HOE 313 of the first in-coupling HOE 31 are misaligned in the lengthwise direction. The red light in-coupling HOE 321, the green light in-coupling HOE 322, and the blue light in-coupling HOE 323 of the second in-coupling HOE 32 are misaligned in the lengthwise direction.

First and second out-coupling HOEs 41 and 42 consist of red light out-coupling HOEs 411 and 421, green light out-coupling HOEs 412 and 422, and blue light out-coupling HOEs 413 and 423, respectively. The two red light out-coupling HOEs 411 and 421 are stacked at the back side of the first waveguide 21 in the out-coupling zone OZ, the two green light out-coupling HOEs 412 and 422 are stacked at the back side of the second waveguide 22 in the out-coupling zone OZ, and the two blue light out-coupling HOEs 413 and 423 are stacked at the back side of the third waveguide 23 in the out-coupling zone OZ.

The first embodiment, the second embodiment, and the third embodiment share the use of hologram waveguides provided in a side-by-side arrangement for the transmission of left eye's images and right eye's images in common.

Fourth Embodiment

Figure 8:
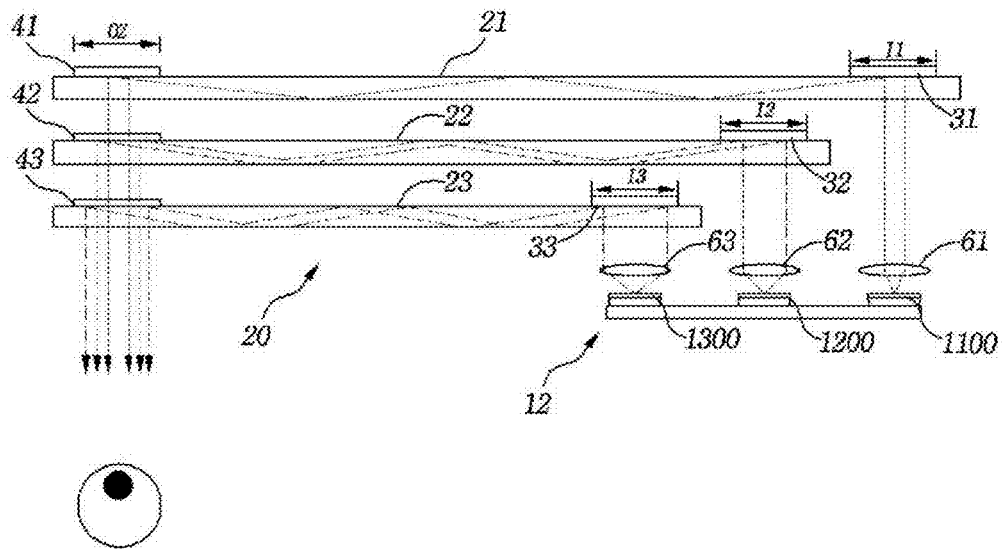
FIG. 8 is a view for illustrating the constitution of a display apparatus according to a fourth embodiment of the present disclosure.

FIG. 8 illustrates the constitution of a display apparatus according to a fourth embodiment of the present invention.

Referring to FIG. 8, the display apparatus includes an LED display unit 12, a light guide unit 20, first, second, and third in-coupling HOEs 31, 32, and 33, and first, second, and third out-coupling HOEs 41, 42, and 43. Although the first in-coupling HOEs and the first out-coupling HOEs have been described in connection with left eye' images and the second in-coupling HOEs and the second out-coupling HOEs have been described in connection with right eye's images in the foregoing embodiments, it is noted that these descriptions do not apply to the following embodiments.

The LED display unit 12 includes a first LED display panel 1100 including a plurality of two-dimensionally arrayed red LED cells 130a (see FIG. 2) to emit red image lights, a plurality of two-dimensionally arrayed green LED cells 130b to emit green image lights, and a plurality of two-dimensionally arrayed blue LED cells 130c (see FIG. 2) to emit blue image lights.

The first LED display panel 1100, the second LED display panel 1200, and the third LED display panel 1300 are arrayed parallel to each other at two-dimensionally different positions on a single substrate.

The light guide unit 20 includes a first waveguide 21, a second waveguide 22, and a third waveguide 23 corresponding to the first, second, and third LED display panels 1100, 1200, and 1300, respectively. The first waveguide 21, the second waveguide 22, and the third waveguide 23 guide red image lights, green image lights, and blue image lights emitted from the first, second, and third LED display panels 1100, 1200, and 1300, respectively. The red image lights, the green image lights, and the blue image lights are individually received in different zones of the light guide unit 20. The first waveguide 21, the second waveguide 22, and the third waveguide 23 are arranged parallel to each other from the top. The light guide unit 20 collectively emits the red image lights, the green image lights, and the blue image lights guided through the first waveguide 21, the second waveguide 22, and the third waveguide 23, respectively, from one zone to form desired pictures/images.

The waveguide 20 includes a first in-coupling zone I1 facing the first LED display panel 1100, a second in-coupling zone I2 facing the second LED display panel 1200, and a third in-coupling zone I3 facing the third LED display panel 1300. The first in-coupling zone I1, the second in-coupling zone I2, and the third in-coupling zone I3 are arranged in this order in one lengthwise direction. The red image lights from the first LED display panel 1100 enter the first waveguide 21 in the first in-coupling zone I1, the green image lights from the second LED display panel 1200 enter the second waveguide 22 in the second in-coupling zone I2, and the blue image lights from the second LED display panel 1300 enter the third waveguide 23 in the third in-coupling zone I3.

The first, second, and third waveguides 21, 22, and 23 have different extensions in one lateral direction. Specifically, the longest first waveguide 21 is arranged at the rear of the second and third waveguides 22 and 23 and is more elongated laterally in the lengthwise direction than the second and third waveguides 22 and 23 and the first in-coupling zone I1 is formed in the elongated portion of the first waveguide 21. The second longest second waveguide 22 is arranged at the rear of the third waveguide 23 and is more elongated laterally in the lengthwise direction than the third waveguide 23 and the second in-coupling zone I2 is formed in the elongated portion of the second waveguide 22. Since the third waveguide 23 is arranged in the foremost position, the third in-coupling zone I3 is exposed even without extension.

Red, green, and blue collimating lenses 61, 62, and 63 are arranged in front of the first, second, and third LED display panels 1100, 1200, and 1300 to collimate the red, green, and blue image lights and send the collimated lights to the first, second, and third waveguides 21, 22, and 23, respectively. The first, second, and third collimating lenses 61, 62, and 63 may also be integrated with the first, second, and third LED display panels 1100, 1200, and 1300, respectively.

The light guide unit 20 includes an out-coupling zone OZ at the other side in the lengthwise direction. The red image lights, the green image lights, and the blue image lights individually guided along the first waveguide 21, the second waveguide 21, and the third waveguide 12, respectively, are emitted collectively along one vertical line from the out-coupling zone OZ.

The first in-coupling HOE 31 is placed at the back side of the first waveguide 21 in the first in-coupling zone I1 to diffract and hologram the red image lights entering from the first LED display panel 1100. The hologrammed red image lights reach the out-coupling zone OZ through the first waveguide 21 by total internal reflection. The second in-coupling HOE 32 is placed at the back side of the second waveguide 22 in the second in-coupling zone I2 to diffract and hologram the green image lights entering from the second LED display panel 1200. The hologrammed green image lights reach the out-coupling zone OZ through the second waveguide 22 by total internal reflection. The third in-coupling HOE 33 is placed at the back side of the third waveguide 23 in the third in-coupling zone I3 to diffract and hologram the blue image lights entering from the third LED display panel 1300. The hologrammed blue image lights reach the out-coupling zone OZ through the third waveguide 23 by total internal reflection.

The first out-coupling HOE 41, the second out-coupling HOE 42, and the third out-coupling HOE 43 are arranged in the out-coupling zone OZ and are placed at the back sides of the first waveguide 21, the second waveguide 22, and the third waveguide 23, respectively, along an imaginary vertical line passing perpendicular to the first waveguide 21, the second waveguide 22, and the third waveguide 23. The red, green, and blue image lights arriving at the out-coupling zone OZ along the first waveguide 21, the second waveguide 22, and the third waveguide 23 are diffracted by the first out-coupling HOE 41, the second out-coupling HOE 42, and the third out-coupling HOE 43, respectively, are emitted collectively from the out-coupling zone, and reach the eyes of a viewer to whom desired pictures/images are provided.

In the display apparatus according to the present embodiment, the first, second, and third LED display panels 1100, 1200, and 1300 of the LED display unit 12 are spaced apart from each other to supply red, green, and blue image lights; the first, second, and third in-coupling HOEs 31, 32, and 33 are spaced apart from each other at one side of the light guide unit 20, individually diffract the entering red, green, and blue image lights; the light guide unit 20 delivers the red, green, and blue image lights without overlapping; and the first, second, and third out-coupling HOEs 41, 42, and 43 arranged in the single out-coupling zone OZ merge the image lights and emit the merged image lights to provide full-color display images with high quality to the eyes of a viewer.

The construction and the production method of the LED display unit according to the present embodiment are the same as or similar to those of the LED display unit according to the embodiment described with reference to FIGS. 4 and 6, and their detailed description is omitted to avoid duplication.

Fifth Embodiment

Figure 9:
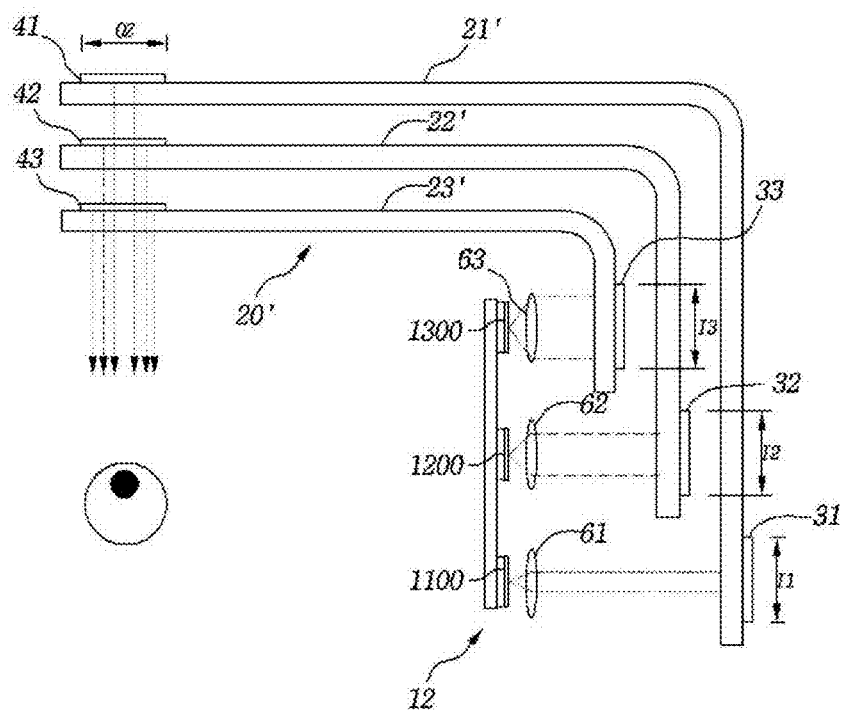
FIG. 9 is a view for illustrating the constitution of a display apparatus according to a fifth embodiment of the present disclosure.

FIG. 9 illustrates the constitution of a display apparatus according to a fifth embodiment of the present invention.

Referring to FIG. 9, the display apparatus includes an LED display unit 12, a light guide unit 20', first, second, and third in-coupling HOEs 31, 32, and 33, and first, second, and third out-coupling HOEs 41, 42, and 43, like the display apparatus according to the fourth embodiment.

The waveguides of the light guide unit according to the fourth embodiment are straight, whereas first, second, and third waveguides 21', 22', and 23' of the light guide unit 20' of the present embodiment are flexible. Each of the flexible first, second, and third waveguides 21', 22', and 23' is bent at an angle of approximately 90° such that in-coupling zones form angles of approximately 90° with respect to an out-coupling zone OZ.

The LED display unit 12 is substantially at a right angle to the out-coupling zone OZ of the light guide unit 20 and is parallel to the in-coupling zones I1, I2, and I3. First, second, and third LED display panels 1100, 1200, and 1300 of the LED display unit 12 face the in-coupling HOEs 31, 32, and 33 arranged in the in-coupling zones I1, I2, and I3, respectively.

Since the flexible light guides 21', 22', and 23' of the light guide unit 20' are bent at predetermined angles, the display apparatus is made thinner and lighter. Therefore, the display apparatus is advantageously available as an eye-wearable device.

What is claimed is:

1. A display apparatus comprising:
   at least one light emitting diode (LED) display unit comprising a plurality of LED display panels outputting image lights;
   a light guide unit comprising a plurality of in-coupling zones where the image lights are received and a single out-coupling zone to which the received image lights are guided;
   a plurality of in-coupling holographic optical elements (HOEs) arranged in the in-coupling zones to define a propagation path of the image lights through the light guide unit; and
   a plurality of out-coupling HOEs arranged in the out-coupling zone to define a path through which the image lights guided through the light guide unit are sent outside the light guide unit,
   wherein the light guide unit comprises at least one waveguide,
   wherein the plurality of in-coupling HOEs comprise:
      a first in-coupling HOE arranged on a first side of the waveguide and defining a propagation path of a first image light through the waveguide; and
      a second in-coupling HOE arranged on a second side of the waveguide opposite to the first side and defining a propagation path of a second image light through the waveguide,
   wherein the plurality of out-coupling HOEs comprise:
      a first out-coupling HOE stacked on a back surface of the waveguide between the first and second sides of the waveguide for deflecting the first image light traveling along the propagation path defined by the first in-coupling HOE and sending the deflected first image light toward the right eye of a viewer, and
      a second out-coupling HOE stacked on the first out-coupling HOE for deflecting the second image light traveling along the propagation path defined by the second in-coupling HOE and sending the deflected second image light toward the left eye of the viewer.

2. The display apparatus according to claim 1, wherein the plurality of LED display panels comprise:
   a first LED display panel including a plurality of two-dimensionally arrayed first LED cells to output a first wavelength image light,
   a second LED display panel including a plurality of two-dimensionally arrayed second LED cells to output a second wavelength image light, and
   a third LED display panel including a plurality of two-dimensionally arrayed third LED cells to output a third wavelength image light.

3. The display apparatus according to claim 2, wherein the first LED display panel, the second LED display panel, and the third LED display panel are arranged at two-dimensionally different positions on a single substrate.

4. The display apparatus according to claim 2, wherein the LED display unit further comprises a single CMOS backplane coupled to the first LED display panel, the second LED display panel, and the third LED display panel and comprising a plurality of CMOS cells corresponding to the first LED cells, the second LED cells, and the third LED cells to individually drive the LED cells in groups.

5. The display apparatus according to claim 2, wherein the at least one waveguide comprises:
   a first waveguide guiding a first wavelength image light outputted from the first LED display panel and received in a first in-coupling zone to the out-coupling zone,
   a second waveguide guiding a second wavelength image light outputted from the second LED display panel and received in a second in-coupling zone to the out-coupling zone, and
   a third waveguide guiding a third wavelength image light outputted from the third LED display panel and received in a third in-coupling zone to the out-coupling zone;
   wherein the plurality of in-coupling HOEs comprise:
      a first in-coupling HOE arranged on the first waveguide in the first in-coupling zone,
      a second in-coupling HOE arranged on the second waveguide in the second in-coupling zone, and
      a third in-coupling HOE arranged on the third waveguide in the third in-coupling zone; and
   wherein the plurality of out-coupling HOEs are within the common out-coupling zone and comprise a first out-coupling HOE, a second out-coupling HOE, and a third out-coupling HOE arranged on the first waveguide, the second waveguide, and the third waveguide, respectively.

6. The display apparatus according to claim 5, wherein:
   the first waveguide, the second waveguide, and the third waveguide are arranged parallel to each other,
   the first waveguide is positioned over the second waveguide and the third waveguide and is more elongated laterally in the lengthwise direction than the second waveguide and the third waveguide, and the first in-coupling zone is formed in the elongated portion of the first waveguide, and
   the second waveguide is positioned over the third waveguide and is more elongated laterally in the lengthwise direction than the third waveguide, and the second in-coupling zone is formed in the elongated portion of the second waveguide.

7. The display apparatus according to claim 2, wherein the plurality of in-coupling HOEs comprise:

a plurality of first in-coupling HOEs comprising a first wavelength light in-coupling HOE, a second wavelength light in-coupling HOE, and a third wavelength light in-coupling HOE arranged in a first in-coupling zone, and a plurality of second in-coupling HOEs comprising a first wavelength light in-coupling HOE, a second wavelength light in-coupling HOE, and a third wavelength light in-coupling HOE arranged in a second in-coupling zone, the first wavelength light in-coupling HOEs, the second wavelength light in-coupling HOEs, and the third wavelength light in-coupling HOEs define the propagation paths of first wavelength image lights, second wavelength image lights, and third wavelength image lights, respectively.

8. The display apparatus according to claim 2, wherein the plurality of out-coupling HOEs comprise first out-coupling HOEs and second out-coupling HOEs stacked adjacent to the light guide unit in the out-coupling zone;

wherein the first out-coupling HOEs comprise a first wavelength light out-coupling HOE, a second wavelength light out-coupling HOE, and a third wavelength light out-coupling HOE arranged in the out-coupling zone such that the first wavelength image light, the second wavelength image light, and the third wavelength image light are sent toward the left eye of a viewer outside the light guide unit; and wherein the second out-coupling HOEs comprise a first wavelength light out-coupling HOE, a second wavelength light out-coupling HOE, and a third wavelength light out-coupling HOE arranged in the out-coupling zone such that the first wavelength image light, the second wavelength image light, and the third wavelength image light are sent toward the right eye of the viewer.

9. The display apparatus according to claim 2, wherein the at least one waveguide comprises:

a first waveguide guiding first wavelength image lights outputted from first wavelength light emitting display panels and received in the plurality of in-coupling zones to the out-coupling zone, a second waveguide guiding second wavelength image lights outputted from second wavelength light emitting display panels and received in the plurality of in-coupling zones to the out-coupling zone, and a third waveguide guiding third wavelength image lights outputted from third wavelength light emitting display panels and received in the plurality of in-coupling zones to the out-coupling zone.

10. The display apparatus according to claim 9, wherein the plurality of in-coupling HOEs comprise:

a first red light in-coupling HOE arranged on the first side of the first waveguide in the plurality of in-coupling zones and defining a first propagation path of a first red image light through the first waveguide, a second red light in-coupling HOE arranged on the second side of the first waveguide in the plurality of in-coupling zones and defining a second propagation path of a second red image light through the first waveguide, a first green light in-coupling HOE arranged on the first side of the second waveguide in the plurality of in-coupling zones and defining a third propagation path of a first green image light through the second waveguide, a second green light in-coupling HOE arranged on the second side of the second waveguide in the plurality of in-coupling zones and defining a fourth propagation path of a second green image light through the second waveguide, a first blue light in-coupling HOE arranged on the first side of the third waveguide in the plurality of in-coupling zones and defining a fifth propagation path of a first blue image light through the third waveguide, and a second blue light in-coupling HOE arranged on the second side of the third waveguide in the plurality of in-coupling zones and defining a sixth propagation path of a second blue image light through the third waveguide.

11. The display apparatus according to claim 10, wherein the plurality of out-coupling HOEs comprise:

a first red light out-coupling HOE stacked on a back surface of the first waveguide between the first and second sides of the first waveguide for deflecting the first red image light traveling along the first propagation path and sending the deflected the first red image light toward the right eye of the viewer, a second red light out-coupling HOE stacked on the first red light out-coupling HOE for deflecting the second red image light traveling along the second propagation path and sending the deflected second red image light toward the left eye of the viewer, a first green light out-coupling HOE stacked on a back surface of the second waveguide between the first and second sides of the second waveguide for deflecting the first green image light traveling along the third propagation path and sending the deflected the first green image light toward the right eye of the viewer, a second green light out-coupling HOE stacked on the first green light out-coupling HOE for deflecting the second green image light traveling along the fourth propagation path and sending the deflected second green image light toward the left eye of the viewer, a first blue light out-coupling HOE stacked on a back surface of the third waveguide between the first and second sides of the third waveguide for deflecting the first blue image light traveling along the fifth propagation path and sending the deflected first blue image light toward the right eye of the viewer, and a second blue light out-coupling HOE stacked on the first blue light out-coupling HOE for deflecting the second blue image light traveling along the sixth propagation path and sending the deflected second blue image light toward the left eye of the viewer.

12. The display apparatus according to claim 1, wherein the at least one waveguide comprises a plurality of waveguides guiding the image lights individually received in the plurality of in-coupling zones to the out-coupling zone.

13. The display apparatus according to claim 12, wherein the plurality of waveguides extend different distances in one lateral direction.

14. The display apparatus according to claim 1, wherein each of the plurality of in-coupling HOEs is arranged in the in-coupling zones and the plurality of out-coupling HOEs are arranged in the out-coupling zone.

15. The display apparatus according to claim 1, wherein the light guide unit comprises waveguides whose shape is straight or bent as a whole.

16. The display apparatus according to claim 1, further comprising collimating lenses arranged between the LED display panels and the light guide unit to collimate the image lights.

17. The display apparatus according to claim 1, wherein the LED display unit further comprises an LED display panel comprising a plurality of LED cells and a CMOS backplane comprising a plurality of CMOS cells; and wherein bumps are interposed between the LED cells and the CMOS cells in a state in which the LED cells and the CMOS cells are arranged to face each other.

18. The display apparatus according to claim 17, wherein the plurality of LED cells are formed by growing a first conductive semiconductor layer, an active layer, and a second conductive semiconductor layer in this order on a substrate and etching the layers;
   wherein each of the plurality of LED cells has a vertical structure comprising the substrate, the first conductive semiconductor layer, the active layer, and the second conductive semiconductor layer formed in this order;
   wherein the active layer and the second conductive semiconductor layer are removed from the exposed portions of the LED display panel where none of the plurality of LED cells are formed; and
   wherein a first conductive metal layer is formed over the portion of the first conductive semiconductor layer where none of the LED cells of the LED display panel are formed.

19. A display apparatus comprising:
   a first display unit comprising a plurality of LED displays emitting lights of different wavelengths and providing a left eye's image light;
   a second display unit comprising a plurality of LED displays emitting lights of different wavelengths and providing a right eye's image light;
   an optical guide unit configured to receive the left eye's image light from a first in-coupling zone formed at one side and the right eye's image light from a second in-coupling zone formed at the other side and guide the left eye's image light and the right eye's image light to an out-coupling zone located between the first in-coupling zone and the second in-coupling zone;
   a plurality of first in-coupling HOEs disposed on a same straight line in the first in-coupling zone to receive the respective lights of different wavelengths of the first display unit and define a propagation path of the lights of different wavelengths through the light guide unit;
   a plurality of second in-coupling HOEs disposed on a same straight line in the second in-coupling zone to receive the respective lights of different wavelengths of the second display unit and define a propagation path of the light through the light guide unit;
   a plurality of first out-coupling HOEs disposed in the out-coupling zone to define a path through which the lights of different wavelengths of the first display unit guided through the light guide unit are sent outside the light guide unit; and
   a plurality of second out-coupling HOEs stacked on the plurality of first out-coupling HOEs to define a path through which the lights of different wavelengths of the second display unit guided through the light guide unit are sent outside the light guide unit.

20. The display apparatus according to claim 19, wherein the plurality of LED displays comprise a first LED cell emitting light of a first wavelength, a second LED cell emitting light of a second wavelength, and a third LED cell emitting light of a third wavelength.

21. The display apparatus according to claim 20, wherein the plurality of first in-coupling HOEs and the plurality of second in-coupling HOEs comprise a first wavelength light in-coupling HOE for receiving the light of the first wavelength, a second wavelength light in-coupling for receiving the light of the second wavelength, and a third wavelength light in-coupling HOE for receiving the light of the third wavelength.

22. The display apparatus according to claim 20, wherein the plurality of first out-coupling HOEs and the plurality of second out-coupling HOEs comprise a first wavelength light out-coupling HOE for emitting the light of the first wavelength, a second wavelength light out-coupling HOE for emitting the light of the second wavelength, and a third wavelength light out-coupling HOE for emitting the light of the third wavelength.

23. The display apparatus according to claim 22, wherein the first wavelength light out-coupling HOE of the first out-coupling HOE is disposed on the third wavelength light out-coupling HOE of the second out-coupling HOE.

24. The display apparatus according to claim 19, wherein the first out-coupling HOE outputs the lights of different wavelengths of the left eye's image to a left eye of a viewer, and the second out-coupling HOE outputs the lights of different wavelengths of the right eye's image to a right eye of the viewer.

* * * * *